United States Patent
Banin et al.

(10) Patent No.: US 9,154,078 B2
(45) Date of Patent: *Oct. 6, 2015

(54) DEVICE, SYSTEM AND METHOD OF WIRELESS COMMUNICATION OVER A PLURALITY OF WIRELESS COMMUNICATION FREQUENCY CHANNELS

(75) Inventors: Rotem Banin, Zur Moshe (IL); Ofir Degani, Haifa (IL)

(73) Assignee: INTEL CORPORATION, Santa Clara, CA (US)

( * ) Notice: Subject to any disclaimer, the term of this patent is extended or adjusted under 35 U.S.C. 154(b) by 839 days.

This patent is subject to a terminal disclaimer.

(21) Appl. No.: 12/977,382

(22) Filed: Dec. 23, 2010

(65) Prior Publication Data

US 2012/0163492 A1   Jun. 28, 2012

(51) Int. Cl.
| | | |
|---|---|---|
| H04B 1/40 | (2015.01) | |
| H01Q 11/12 | (2006.01) | |
| H04B 1/04 | (2006.01) | |
| H04B 1/10 | (2006.01) | |
| H03C 1/60 | (2006.01) | |

(52) U.S. Cl.
CPC ..................................... H03C 1/60 (2013.01)

(58) Field of Classification Search
USPC ........... 455/76, 118, 255, 257, 258, 259, 260, 455/265, 314, 318; 331/1 R, 60
See application file for complete search history.

(56) References Cited

U.S. PATENT DOCUMENTS

| | | | |
|---|---|---|---|
| 6,269,253 B1 * | 7/2001 | Maegawa et al. .......... 455/552.1 |
| 6,728,525 B1 * | 4/2004 | Leizerovich et al. ......... 455/260 |
| 6,831,525 B1 * | 12/2004 | Beaudin et al. ............... 331/176 |
| 7,869,781 B2 * | 1/2011 | Li et al. .......................... 455/230 |
| 7,949,309 B2 * | 5/2011 | Rofougaran et al. ........... 455/77 |
| 8,391,803 B2 * | 3/2013 | Banin et al. ...................... 455/76 |
| 8,498,359 B2 * | 7/2013 | Lauer et al. .................... 375/267 |
| 2005/0020299 A1 * | 1/2005 | Malone et al. ............. 455/552.1 |
| 2005/0141406 A1 * | 6/2005 | Maltsev et al. ............... 370/203 |
| 2006/0046773 A1 | 3/2006 | Aycin et al. |
| 2006/0238262 A1 * | 10/2006 | Opris .............................. 331/16 |
| 2007/0259640 A1 | 11/2007 | Pandey |
| 2009/0156149 A1 * | 6/2009 | Plevridis et al. .............. 455/260 |
| 2009/0163157 A1 * | 6/2009 | Zolfaghari ................. 455/127.1 |
| 2011/0292973 A1 * | 12/2011 | Kianush et al. ............... 375/147 |

(Continued)

OTHER PUBLICATIONS

IEEE Standard for Information technology—Telecommunications and information exchange between systems—Local and metropolitan area networks—Specific requirements Part 11: Wireless LAN Medium Access Control (MAC) and Physical Layer (PHY) Specifications IEEE Std 802.11™—2007 (Revision of IEEE Std 802.11-1999 ).

(Continued)

Primary Examiner — Nguyen Vo
(74) Attorney, Agent, or Firm — Pillsbury Winthrop Shaw Pittman LLP

(57) ABSTRACT

Some demonstrative embodiments include devices, systems and/or methods of wireless communication over a plurality of wireless communication frequency channels. For example, a wireless communication device may include a frequency source to generate a source frequency signal; a plurality of local-oscillator (LO) generators to generate a respective plurality of different carrier signal frequencies based on the source frequency signal; and a plurality of radio-frequency (RF) paths to simultaneously communicate over the plurality of carrier signal frequencies, respectively.

32 Claims, 4 Drawing Sheets

(56) References Cited

U.S. PATENT DOCUMENTS

2012/0069746 A1* 3/2012 Park .............................. 370/252
2012/0069876 A1* 3/2012 Kamizuma et al. ........... 375/219
2012/0140646 A1* 6/2012 Stephens ....................... 370/252

OTHER PUBLICATIONS

U.S. Appl. No. 12/977,410, filed Dec. 23, 2010.
International Search Report and the Written Opinion, mail date Jun. 28, 2012, PCT/ISA/210, PCT/ISA/220, PCT/ISA/237, a total of 9 pages.

* cited by examiner

DEVICE, SYSTEM AND METHOD OF WIRELESS COMMUNICATION OVER A PLURALITY OF WIRELESS COMMUNICATION FREQUENCY CHANNELS

BACKGROUND

A wireless communication device may communicate over a plurality of wireless communication frequency channels, e.g., simultaneously.

The device may include a plurality of frequency generation circuits to generate a respective plurality of carrier signal frequencies corresponding to the plurality of wireless communication frequency channels.

Each frequency generation circuit includes a Voltage Controlled Oscillator (VCO) controlled by a Phase-locked-loop (PLL), to generate a respective source frequency, and a Local Oscillator (LO) generator to convert the source frequency into a predefined carrier signal frequency according to a preset conversion ratio.

BRIEF DESCRIPTION OF THE DRAWINGS

For simplicity and clarity of illustration, elements shown in the figures have not necessarily been drawn to scale. For example, the dimensions of some of the elements may be exaggerated relative to other elements for clarity of presentation. Furthermore, reference numerals may be repeated among the figures to indicate corresponding or analogous elements. The figures are listed below.

DETAILED DESCRIPTION

Figure 1:
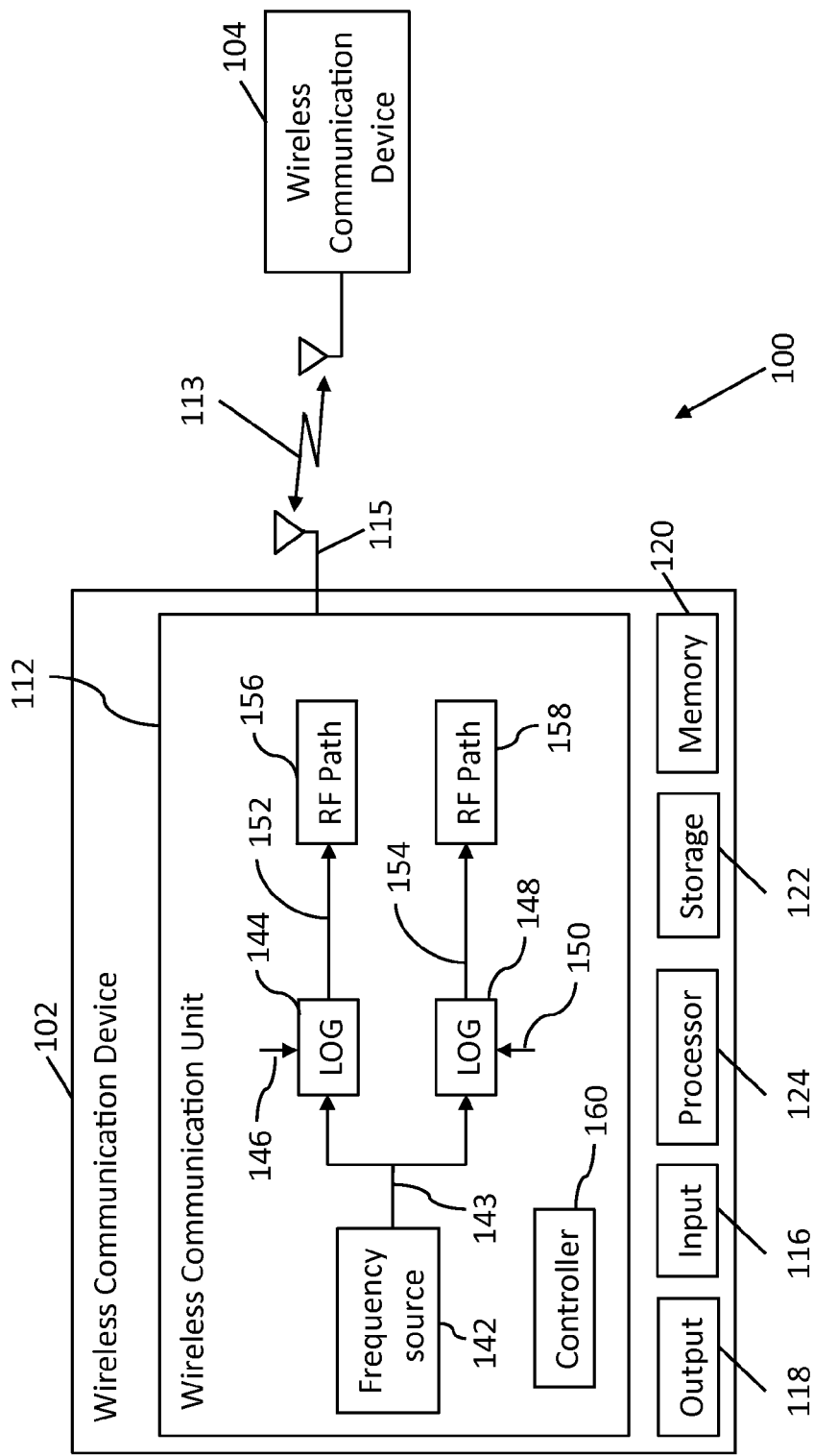
FIG. 1 is a schematic block diagram illustration of a system, in accordance with some demonstrative embodiments.

In the following detailed description, numerous specific details are set forth in order to provide a thorough understanding of some embodiments. However, it will be understood by persons of ordinary skill in the art that some embodiments may be practiced without these specific details. In other instances, well-known methods, procedures, components, units and/or circuits have not been described in detail so as not to obscure the discussion.

Discussions herein utilizing terms such as, for example, "processing", "computing", "calculating", "determining", "establishing", "analyzing", "checking", or the like, may refer to operation(s) and/or process(es) of a computer, a computing platform, a computing system, or other electronic computing device, that manipulate and/or transform data represented as physical (e.g., electronic) quantities within the computer's registers and/or memories into other data similarly represented as physical quantities within the computer's registers and/or memories or other information storage medium that may store instructions to perform operations and/or processes.

The terms "plurality" and "a plurality" as used herein include, for example, "multiple" or "two or more". For example, "a plurality of items" includes two or more items.

Some embodiments may be used in conjunction with various devices and systems, for example, a Personal Computer (PC), a desktop computer, a mobile computer, a laptop computer, a notebook computer, a tablet computer, a server computer, a handheld computer, a handheld device, a Personal Digital Assistant (PDA) device, a handheld PDA device, an on-board device, an off-board device, a hybrid device, a vehicular device, a non-vehicular device, a mobile or portable device, a consumer device, a non-mobile or non-portable device, a wireless communication station, a wireless communication device, a wireless Access Point (AP), a wired or wireless router, a wired or wireless modem, a video device, an audio device, an audio-video (AN) device, a Set-Top-Box (STB), a Blu-ray disc (BD) player, a BD recorder, a Digital Video Disc (DVD) player, a High Definition (HD) DVD player, a DVD recorder, a HD DVD recorder, a Personal Video Recorder (PVR), a broadcast HD receiver, a video source, an audio source, a video sink, an audio sink, a stereo tuner, a broadcast radio receiver, a flat panel display, a Personal Media Player (PMP), a digital video camera (DVC), a digital audio player, a speaker, an audio receiver, an audio amplifier, a gaming device, a data source, a data sink, a Digital Still camera (DSC), a wired or wireless network, a wireless area network, a Wireless Video Area Network (WVAN), a Local Area Network (LAN), a Wireless LAN (WLAN), a Wireless Metropolitan Area Network (WMAN) communication system, a Personal Area Network (PAN), a Wireless PAN (WPAN), devices and/or networks operating in accordance with existing IEEE 802.11 (IEEE 802.11-2007: Standard for Information technology—Telecommunications and information exchange between systems—Local and metropolitan area networks—Specific requirements, Part 11: Wireless LAN Medium Access Control (MAC) and Physical Layer (PHY) Specifications—June 2007), 802.11n ("IEEE 802.11n-2009—Amendment 5: Enhancements for Higher Throughput. IEEE-SA. Oct. 29, 2009"), 802.11ac ("Very High Throughput <6 Ghz"), 802.11 task group ad (TGad) ("Very High Throughput 60 GHz") standards ("the 802.11 standards"), 802.16 (IEEE-Std 802.16, 2004 Edition, Air Interface for Fixed Broadband Wireless Access Systems), 802.16d, 802.16e (IEEE-Std 802.16e, 2005 Edition, Physical and Medium Access Control Layers for Combined Fixed and Mobile Operation in Licensed Bands), 802.16f, 802.16m standards ("the 802.16 standards") and/or future versions and/or derivatives thereof, devices and/or networks operating in accordance with existing Wireless-Gigabit-Alliance (WGA) and/or WirelessHD™ specifications and/or future versions and/or derivatives thereof, devices and/or networks operating in accordance with existing cellular specifications and/or protocols, e.g., 3rd Generation Partnership Project (3GPP), 3GPP Long Term Evolution (LTE), and/or future versions and/or derivatives thereof, units and/or devices which are part of the above networks, one way and/or two-way radio communication systems, cellular radio-telephone communication systems, a cellular telephone, a wireless telephone, a Personal Communication Systems (PCS) device, a PDA device which incorporates a wireless communication device, a mobile or portable Global Positioning System (GPS) device, a device which incorporates a GPS receiver or transceiver or chip, a device which incorporates an RFID element or chip, a Multiple Input Multiple Output (MIMO) transceiver or device, a device having one or more internal antennas and/or external antennas, Digital Video Broadcast (DVB) devices or systems, multi-standard radio devices or systems, a wired or wireless handheld device (e.g., BlackBerry, Palm Treo), a Wireless Application Protocol (WAP) device, or the like.

Some embodiments may be used in conjunction with one or more types of wireless communication signals and/or systems, for example, Radio Frequency (RF), Infra Red (IR), Frequency-Division Multiplexing (FDM), Orthogonal FDM (OFDM), Time-Division Multiplexing (TDM), Time-Division Multiple Access (TDMA), Extended TDMA (E-TDMA), General Packet Radio Service (GPRS), extended GPRS, Code-Division Multiple Access (CDMA), Wideband CDMA (WCDMA), CDMA 2000, single-carrier CDMA, multi-carrier CDMA, Multi-Carrier Modulation (MDM), Discrete Multi-Tone (DMT), Bluetooth®, Global Positioning System (GPS), Wi-Fi, Wi-Max, ZigBee™, Ultra-Wideband (UWB), Global System for Mobile communication (GSM), 2G, 2.5G, 3G, 3.5G, Enhanced Data rates for GSM Evolution (EDGE), or the like. Other embodiments may be used in various other devices, systems and/or networks.

The term "wireless device" as used herein includes, for example, a device capable of wireless communication, a communication device capable of wireless communication, a communication station capable of wireless communication, a portable or non-portable device capable of wireless communication, or the like. In some demonstrative embodiments, a wireless device may be or may include a peripheral that is integrated with a computer, or a peripheral that is attached to a computer. In some demonstrative embodiments, the term "wireless device" may be used to provide a wireless service.

Reference is now made to FIG. 1, which schematically illustrates a block diagram of a system 100 in accordance with some demonstrative embodiments.

As shown in FIG. 1, in some demonstrative embodiments, system 100 may include one or more wireless communication devices, e.g., wireless communication devices 102 and/or 104, capable of communicating content, data, information and/or signals over at least one wireless communication link 113, e.g., as described in detail below. One or more elements of system 100 may optionally be capable of communicating over any suitable wired communication links.

In some demonstrative embodiments, wireless communication devices 102 and/or 104 may include or may be included as part of, for example, a PC, a desktop computer, a mobile computer, a laptop computer, a notebook computer, a tablet computer, a server computer, a handheld computer, a handheld device, a PDA device, a handheld PDA device, an on-board device, an off-board device, a hybrid device (e.g., combining cellular phone functionalities with PDA device functionalities), a consumer device, a vehicular device, a non-vehicular device, a mobile or portable device, a non-mobile or non-portable device, a cellular telephone, a handset, a PCS device, a PDA device which incorporates a wireless communication device, a mobile or portable GPS device, a DVB device, a relatively small computing device, a non-desktop computer, a "Carry Small Live Large" (CSLL) device, an Ultra Mobile Device (UMD), an Ultra Mobile PC (UMPC), a Mobile Internet Device (MID), an "Origami" device or computing device, a device that supports Dynamically Composable Computing (DCC), a context-aware device, a video device, an audio device, an A/V device, a STB, a BD player, a BD recorder, a DVD player, a HD DVD player, a DVD recorder, a HD DVD recorder, a PVR, a broadcast HD receiver, a video source, an audio source, a video sink, an audio sink, a stereo tuner, a broadcast radio receiver, a flat panel display, a PMP, a DVC, a digital audio player, a speaker, an audio receiver, a gaming device, an audio amplifier, a data source, a data sink, a DSC, a media player, a Smartphone, a television, a music player, an AP, a base station, or the like.

In some demonstrative embodiments, device 102 may include a wireless communication unit 112 to transmit a wireless transmission to device 104 and/or receive a wireless transmission from device 104, over at least one wireless communication link 113, e.g., via one or more antennas 115. Types of antennas that may be used for antennas 115 may include but are not limited to a phase array antenna, an internal antenna, a dipole antenna, an omni-directional antenna, a monopole antenna, an end fed antenna, a circularly polarized antenna, a micro-strip antenna, a diversity antenna and the like.

In some demonstrative embodiments, wireless communication link 113 may have a bandwidth of at least 160 MegaHertz (MHz), e.g., as described below. In other embodiments, wireless communication link 113 may have any other suitable bandwidth.

In some demonstrative embodiments, wireless communication devices 102 and/or 104 may also include, for example, one or more of a processor 124, an input unit 116, an output unit 118, a memory unit 120, and a storage unit 122. Wireless communication devices 102 and/or 104 may optionally include other suitable hardware components and/or software components. In some demonstrative embodiments, some or all of the components of each of wireless communication devices 102 and/or 104 may be enclosed in a common housing or packaging, and may be interconnected or operably associated using one or more wired or wireless links. In other embodiments, components of each of wireless communication devices 102 and/or 106 may be distributed among multiple or separate devices.

Processor 124 includes, for example, a Central Processing Unit (CPU), a Digital Signal Processor (DSP), one or more processor cores, a single-core processor, a dual-core processor, a multiple-core processor, a microprocessor, a host processor, a controller, a plurality of processors or controllers, a chip, a microchip, one or more circuits, circuitry, a logic unit, an Integrated Circuit (IC), an Application-Specific IC (ASIC), or any other suitable multi-purpose or specific processor or controller. Processor 124 executes instructions, for example, of an Operating System (OS) of wireless communication devices 102 and/or 106 and/or of one or more suitable applications.

Input unit 116 includes, for example, a keyboard, a keypad, a mouse, a touch-pad, a track-ball, a stylus, a microphone, or other suitable pointing device or input device. Output unit 118 includes, for example, a monitor, a screen, a flat panel display, a Cathode Ray Tube (CRT) display unit, a Liquid Crystal Display (LCD) display unit, a plasma display unit, one or more audio speakers or earphones, or other suitable output devices.

Memory unit 120 includes, for example, a Random Access Memory (RAM), a Read Only Memory (ROM), a Dynamic RAM (DRAM), a Synchronous DRAM (SD-RAM), a flash memory, a volatile memory, a non-volatile memory, a cache memory, a buffer, a short term memory unit, a long term memory unit, or other suitable memory units. Storage unit 122 includes, for example, a hard disk drive, a floppy disk drive, a Compact Disk (CD) drive, a CD-ROM drive, a DVD drive, or other suitable removable or non-removable storage units. Memory unit 120 and/or storage unit 122, for example, may store data processed by wireless communication device 102 and/or 104.

In some demonstrative embodiments, wireless communication unit 112 may transmit and/or receive wireless communication signals over a plurality of different wireless communication frequency channels, for example, simultaneously, e.g., as described in detail below.

Some embodiments are described below with reference to communicating over a wireless communication link, e.g., wireless communication link 113, including a plurality of non-contiguous channels. However, other embodiments may be utilized for communicating over any other suitable plurality of wireless communication frequency channels, e.g., simultaneously.

In one example, link 113 may include a Frequency-division duplexing (FDD) link. For example, device 102 may receive a first transmission over a first wireless communication frequency channel of link 113, and transmit, e.g., simultaneously, a second transmission over a second wireless communication frequency channel of link 113.

In another example, device 102 may simultaneously communicate with devices of a first wireless communication system, e.g., a WLAN, over a first wireless communication frequency channel; and with devices of a second wireless communication system, e.g., a WPAN, over a second wireless communication frequency channel.

In yet another example, link 113 may include any suitable duplex communication link.

In some demonstrative embodiments, link 113 may include one or more communication channels within a five Gigahertz frequency band.

In one example, an increased throughput, e.g., above 1 Gigabit-per-second (Gbps) per wireless communication client, may be required in order, for example, to satisfy a demand for transferring increased amounts of data within wireless communication networks, such as, for example, wireless local area networks (WLAN) and/or wireless personal area networks (WPAN). The increased throughput may be achieved, for example, by using a communication link having a wide bandwidth. For example, a bandwidth of more than 80 Mega-Hertz (MHz) may be required in order to provide a throughput greater than 1 Gbps, e.g., in a network operating over a frequency band of 5 Giga-Hertz (GHz) in accordance with the IEEE 802.11 standards. A plurality of wireless communication frequency channels may be required in order to achieve the high bandwidth. For example, more than four 20 MHz channels may be required, e.g., according to the IEEE 802.11 standards, in order to achiever a bandwidth of more than 80 MHz.

In some demonstrative embodiments, wireless communication link 113 may include a plurality of non-contiguous wireless communication channels.

The phrase "non-contiguous channels", as used herein, may refer to two or more wireless communication channels, which are not adjacent, neighboring, and/or bordering one another. In one example, first and second wireless communication channels may be non-contiguous if, for example, the first wireless communication channel is separated from the second wireless communication channel, e.g., by one or more other wireless communication channels, sub-channels, frequency bands, and the like.

In some demonstrative embodiments, at least one channel of the plurality of non-contiguous channels has a bandwidth at least 20 MHz, e.g., at least 80 MHz. In other embodiments, the non-contiguous wireless communication channels may have any other suitable bandwidth.

In one embodiment, wireless communication link 113 may include at least two non-contiguous channels, each having a bandwidth of 80 MHz, or any other bandwidth. In other embodiments, wireless communication link 113 may include any other suitable number of wireless communication channels, which may have any other suitable bandwidth.

Some demonstrative embodiments are described herein with reference to a wireless communication link, e.g., wireless communication link 113, including two non-contiguous wireless communication channels having equal bandwidth, e.g., two 80 MHz channels. However, in other embodiments, the wireless communication link may include two or more non-contiguous wireless communication channels of different bandwidths. In one example, the wireless communication link may include at least one channel having a bandwidth of 80 MHz and at least one channel having a bandwidth different from 80 MHz, e.g., 20 MHz, 40 MHz, 120 MHz, 160 MHz and the like. In other embodiments, wireless communication link 113 may include any other suitable combination of two or more non-contiguous channels having any suitable bandwidth.

In some embodiments, wireless communication link 113 may include one or more additional channels, which may or may not be contiguous to one or more of non-contiguous channels. For example, wireless communication link 113 may include first and second non-contiguous 80 MHz channels, and a third channel, e.g., an 80 MHz channel, which may be contiguous to one of the first and second channels.

In some demonstrative embodiments, at least one channel of the plurality of non-contiguous channels may include two or more contiguous channels or sub-channels. For example, the 80 Mhz cannel may include four contiguous 20 MHz channels, e.g., in accordance with the 802.11 standards and/or any other suitable standard and/or protocol.

In some demonstrative embodiments, wireless communication unit 112 may simultaneously communicate over a plurality of different configurable carrier signal frequencies, for example, a plurality of different configurable carrier signal frequencies, which are configured based on a common source frequency signal, e.g., as described below.

In some demonstrative embodiments, wireless communication unit 112 may include a frequency source 142 to generate a source frequency signal 143. Frequency source 142 may include any suitable frequency source. In one example, frequency source 142 may include a single frequency source including, for example, a single suitable voltage-controlled oscillator (VCO) and a suitable single phase-locked-loop (PLL), e.g., as described below. In another example, frequency source 142 may include any other suitable frequency source capable of generating source frequency signal 143.

In some demonstrative embodiments, wireless communication unit 112 may include a plurality of local-oscillator (LO) generators to generate a respective plurality of different carrier signal frequencies based on source frequency signal 143. For example, wireless communication unit 112 may include a first LO generator 144 to generate a first carrier signal frequency 152 based on source frequency signal 143; and a second LO generator 148 to generate a second carrier signal frequency 154, e.g., different from carrier signal frequency 152, based on source frequency signal 143.

In some demonstrative embodiments, wireless communication unit 112 may include a plurality of radio-frequency (RF) paths to simultaneously communicate over the plurality of carrier signal frequencies, respectively, e.g., as described below.

In some demonstrative embodiments, wireless communication unit 112 may include a first RF path 156 and a second RF path 158 to simultaneously transmit and/or receive wireless communication signals over carrier signal frequencies 152 and 154, respectively. RF paths 156 and 158 may include any suitable transmit (Tx) paths, e.g., including one or more suitable Tx chains, and/or receive (Rx) paths, e.g., including any suitable Rx chains 144.

In one example, carrier signal frequencies 152 and 154 may include carrier signal frequencies corresponding to two respective non-contiguous channels of link 113, e.g., as described above. Accordingly, RF paths 156 and 158 may include two Tx chains to transmit a wireless transmission over the two non-contiguous channels of link 113. In another example, RF paths 156 and 158 may include two Rx chains to receive a wireless transmission over the two non-contiguous channels of link 113.

In another example, wireless communication unit 112 may be configured to generate and/or communicate over more than two carrier signal frequencies. For example, wireless communication unit 112 may be configured to generate four carrier signal frequencies and wireless communication unit 112 may include four RF paths, e.g., including two Rx chains and two Tx chains, to communicate over the four carrier signal frequencies, respectively.

In yet another example, RF path 156 may include a Tx chain to transmit a transmission over carrier signal frequency 152, and RF path 158 may include a Rx chain to receive a transmission over carrier signal frequency 154.

In yet another example, RF path 156 may include a first Tx chain to transmit a transmission over carrier signal frequency 152 of a first wireless communication system, e.g., a WLAN, and RF path 158 may include a second Tx chain to transmit a transmission over carrier signal frequency 154 of a second wireless communication system, e.g., a WPAN.

In some demonstrative embodiments, RF paths 156 and/or 158 may include any suitable Physical-layer (PHY) chains and/or components; any suitable Radio-Frequency (RF) chains and/or components; and/or any other suitable elements.

In some demonstrative embodiments, wireless communication unit 112 may include a controller 160, e.g., a media-access-controller (MAC) or any other suitable controller, to control the communication via RF paths 156 and/or 158, e.g., as described below.

In some demonstrative embodiments, wireless communication unit 112 may be configured to generate a plurality of configurable carrier signal frequencies, e.g., including configurable carrier signal frequencies 152 and/or 154.

In some demonstrative embodiments, controller 160 may controllably set carrier signal frequencies 152 and/or 154, for example, by controlling frequency source 142 and/or LO generators 144 and/or 148, e.g., as described below.

In some demonstrative embodiments, the plurality of LO generators may include a plurality of LO generators to generate a respective plurality of configurable carrier signal frequencies. For example, LO generators 144 and/or 148 may include configurable LO generators to generate configurable carrier signal frequencies 152 and/or 154, respectively.

In some demonstrative embodiments, LO generators 144 and/or 148 may generate configurable carrier signal frequencies 152 and 154 by applying first and second respective configurable conversion ratios to source frequency signal 143, e.g., as described below.

In some demonstrative embodiments, LO generator 144 may be configured to receive a conversion-ratio input 146 representing a configurable conversion ratio to be applied for converting source frequency signal 143 into carrier signal frequency 152; and/or LO generator 148 may be configured to receive a configurable conversion-ratio input 150 representing a conversion ratio to be applied for converting source frequency signal 143 into carrier signal frequency 154. For example, conversion-ratio inputs 144 and/or 150 may be generated by controller 160.

Figure 3:
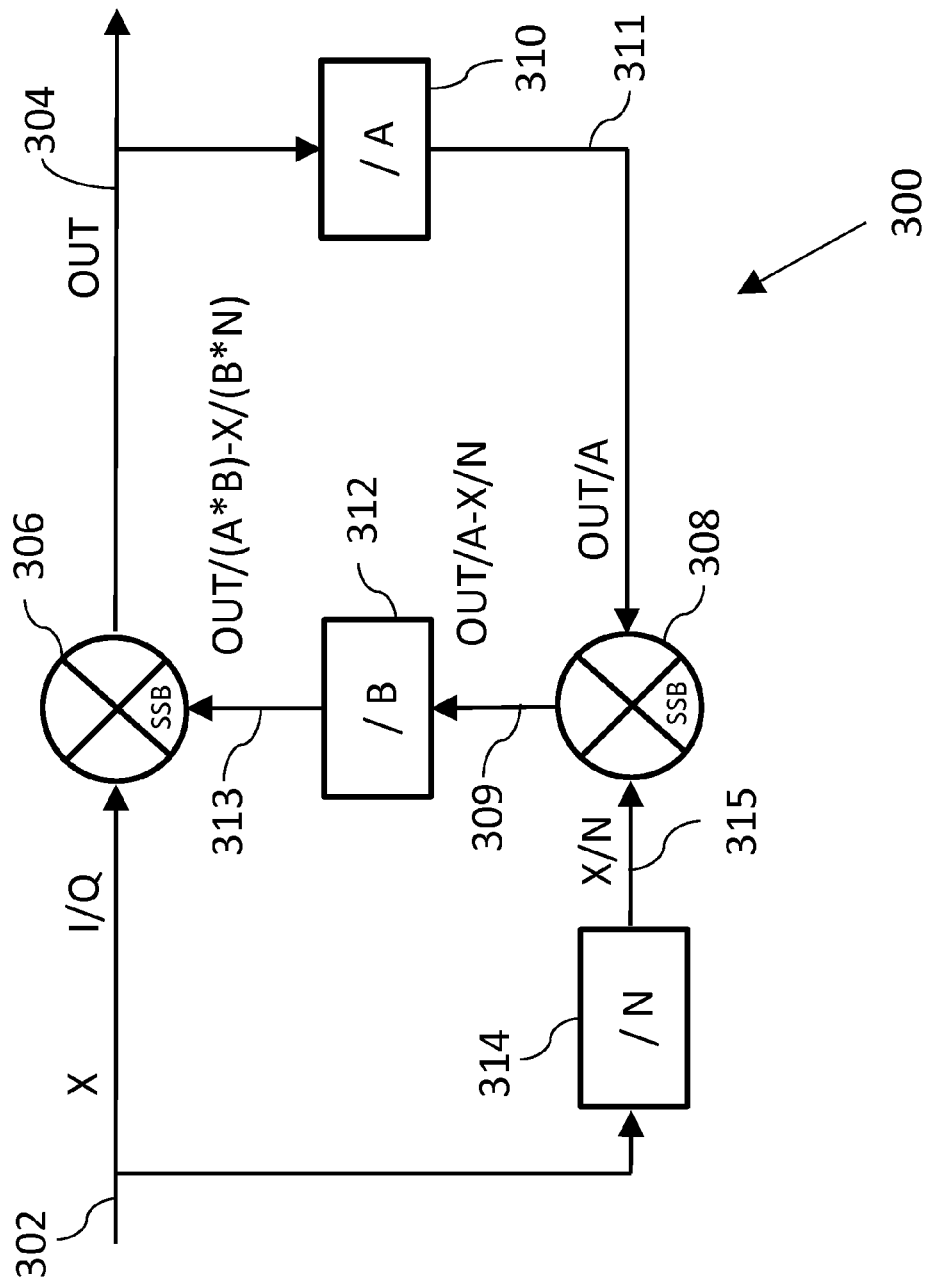
FIG. 3 is a schematic illustration of a configurable Local-Oscillator (LO) generator, in accordance with some demonstrative embodiments.

In some demonstrative embodiments, input 144 may include a plurality of configurable input values, e.g., three configurable input values, and LO generator 144 may convert source frequency signal 143 into carrier signal frequency 152 based on a predefined combination of the plurality of configurable input values; and/or input 150 may include a plurality of configurable input values, e.g., three configurable input values, and LO generator 148 may convert source frequency signal 143 into carrier signal frequency 154 based on a predefined combination of the plurality of configurable input values, e.g., as described below with reference to FIG. 3.

Figure 2:
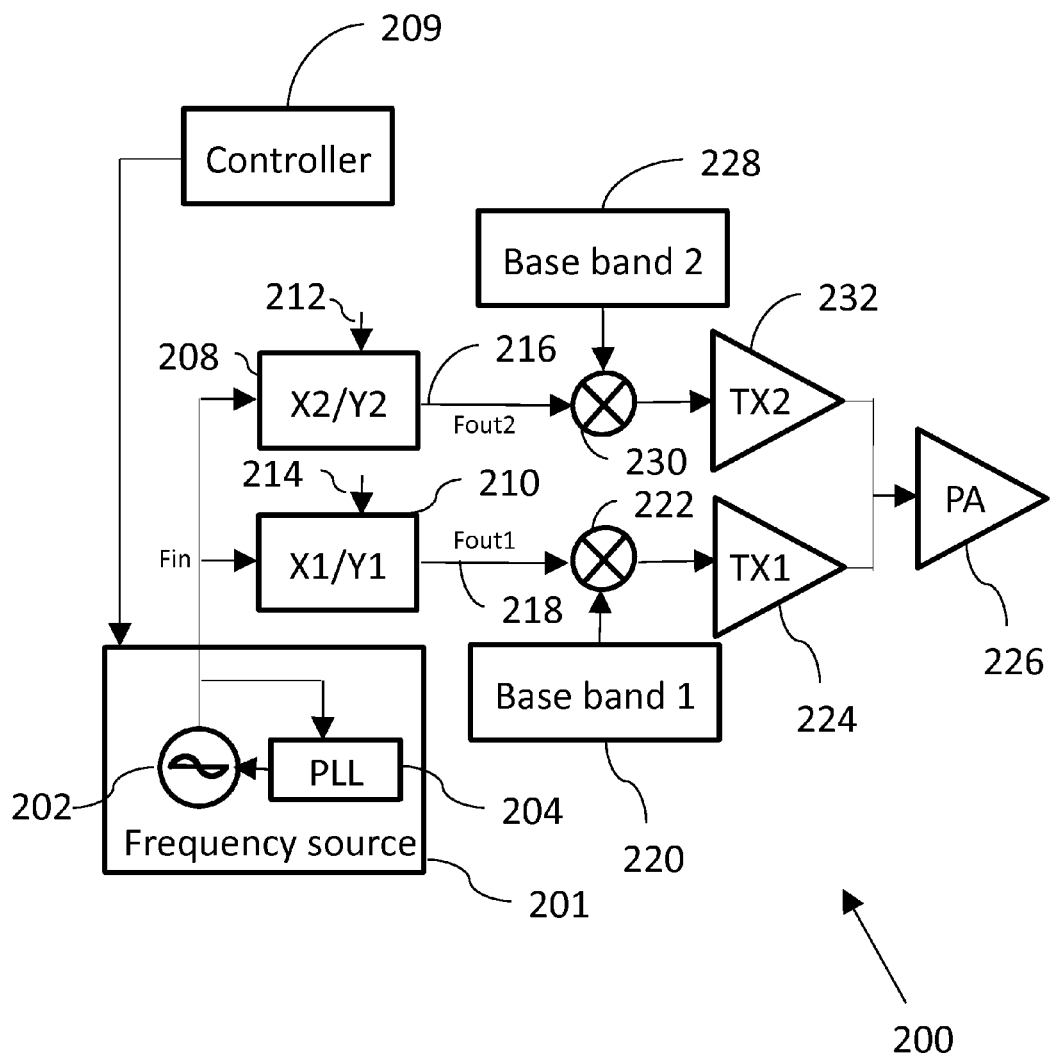
FIG. 2 is a schematic illustration of a transmitter, in accordance with some demonstrative embodiments.

Reference is now made to FIG. 2, which schematically illustrates a transmitter 200, in accordance with some demonstrative embodiments. In some embodiments, transmitter 200 may perform the functionality of wireless communication unit 112 (FIG. 1).

In some demonstrative embodiments, transmitter 200 may include a frequency source 202 to generate a common frequency source signal 206. For example, frequency source may include a suitable VCO 202 controlled by a suitable PLL 204 to generate frequency source signal 206.

In some demonstrative embodiments, transmitter 200 may include a first configurable LO generator 210 to generate a first configurable carrier signal frequency 218 by applying to frequency source signal 206 a first configurable conversion ratio, denoted X1/Y1, e.g., as described below with reference to FIG. 3.

In some demonstrative embodiments, transmitter 200 may include a second configurable LO generator 208 to generate a second configurable carrier signal frequency 216 by applying to frequency source signal 206 a second configurable conversion ratio, denoted X2/Y2, e.g., as described below with reference to FIG. 3.

In some demonstrative embodiments, transmitter 200 may include a controller 209 to configure carrier signal frequencies 216 and/or 218, for example, by controlling configurable LO generators 208 and/or 210, and/or frequency source 201. For example, controller 209 may provide LO generator 210 with one or more input values 214 representing the conversion ratio X1/Y1 resulting in carrier signal frequency 218 of a first required frequency; and/or controller 209 may provide LO generator 208 with one or more input values 212 representing the conversion ratio X2/Y2 resulting in carrier signal frequency 216 of a second required frequency.

In some demonstrative embodiments, transmitter 200 may include a first suitable mixer 222 to modulate a first baseband signal from a first baseband module 220 over carrier signal frequency 218; and a suitable Tx chain 224 to generate a first signal to be transmitted over carrier signal frequency 218.

In some demonstrative embodiments, transmitter 200 may include a second suitable mixer 230 to modulate a second baseband signal from a second baseband module 228 over carrier signal frequency 216; and a suitable Tx chain 232 to generate a second signal to be transmitted over carrier signal frequency 216.

In some demonstrative embodiments, transmitter 200 may also include a suitable RF Power Amplifier (PA) to amplify the signals generated by Tx chains 232 and/or 224.

In some demonstrative embodiments, transmitter 200 may have reduced power consumption, reduced die area, reduced production cost, reduced design complexity and/or increased immunity to oscillator pulling compared, for example, to a transmitter utilizing a plurality of frequency sources for generating a respective plurality of carrier signal frequencies.

Reference is now made to FIG. 3, which schematically illustrates a configurable LO generator 300, in accordance with some demonstrative embodiments. In some demonstrative embodiments, LO generator 300 may perform the functionality of configurable LO generator 144 (FIG. 1), 148 (FIG. 1), 208 (FIG. 2) and/or 210 (FIG. 2).

In some demonstrative embodiments, configurable LO generator 300 may be configured to receive a first configurable input value, denoted A, a second configurable input value, denoted B, and a third configurable input value, denoted N.

In some demonstrative embodiments, configurable LO generator 300 may convert an input frequency 302, denoted X, into an output frequency 304, denoted OUT, according to a conversion ratio, which corresponds to a combination of the input values A, B and N.

In some demonstrative embodiments, configurable LO generator 300 may include a first frequency mixer 306, a second frequency mixer 308, a first programmable divider 310, a second programmable divider 312, and a third programmable divider 314. Mixers 306 and 308 may include any suitable mixers, for example, any suitable Single-Side-Band (SSB) frequency mixers. Dividers 310, 312 and 314 may include any suitable programmable dividers.

In some demonstrative embodiments, divider 310 may be configured to generate a first divider output 311 by dividing output frequency 304 by the value A.

In some demonstrative embodiments, divider 312 may be configured to generate a second divider output 313 by dividing an output 309 of mixer 308 by the value B.

In some demonstrative embodiments, mixer 306 may be configured to generate output 304 based on divider output 313 and frequency input 302. For example, output 304 may correspond to a difference between output 313 and input 302.

In some demonstrative embodiments, divider 314 may be configured to generate a third divider output 315 by dividing input 302 by the value N.

In some demonstrative embodiments, mixer 308 may be configured to generate output 309 based on divider output 311 and divider output 315. For example, output 309 may correspond to a difference between output 311 and output 315.

In some demonstrative embodiments, configurable LO generator 300 may convert the input frequency X into the output frequency OUT, for example, according to the following configurable conversion ratio:

$$\text{OUT} = \left[\frac{(A*B)*(B*N \pm 1)}{(A*B \pm 1)*(B*N)}\right] * X \quad (1)$$

In some demonstrative embodiments, an input value of input values A, B and N may be set, e.g., by controller 160 (FIG. 1), to a selected value of a predefined set of values. For example, the input value A may be set to a selected value of the set 2, 4 and 6; the input value B may be set to a selected value of the set 2, 4 and 6; and/or the input value N may be set to a selected value of the set of values between 12 and 1020. In other embodiments, the input values A, B and/or N may include any other suitable value.

In one example, the input frequency may be set to 10.56 GHz, and the values A, B and N may be configured to 4, 4 and 64, respectively, for example, in order to generate the output frequency OUT of 11.22 GHz, which may be divided into first and second frequencies of 5.61 GHz, e.g., for IQ modulation. The values A, B and N may be configured to 6, 2 and 576, respectively, for example, in order to generate the output frequency OUT of 11.51 GHz, which may be divided into first and second frequencies of 5.755 GHz, e.g., for IQ modulation.

In other embodiments, configurable LO generator 300 may include any other suitable configuration of mixers and/or dividers.

Figure 4:
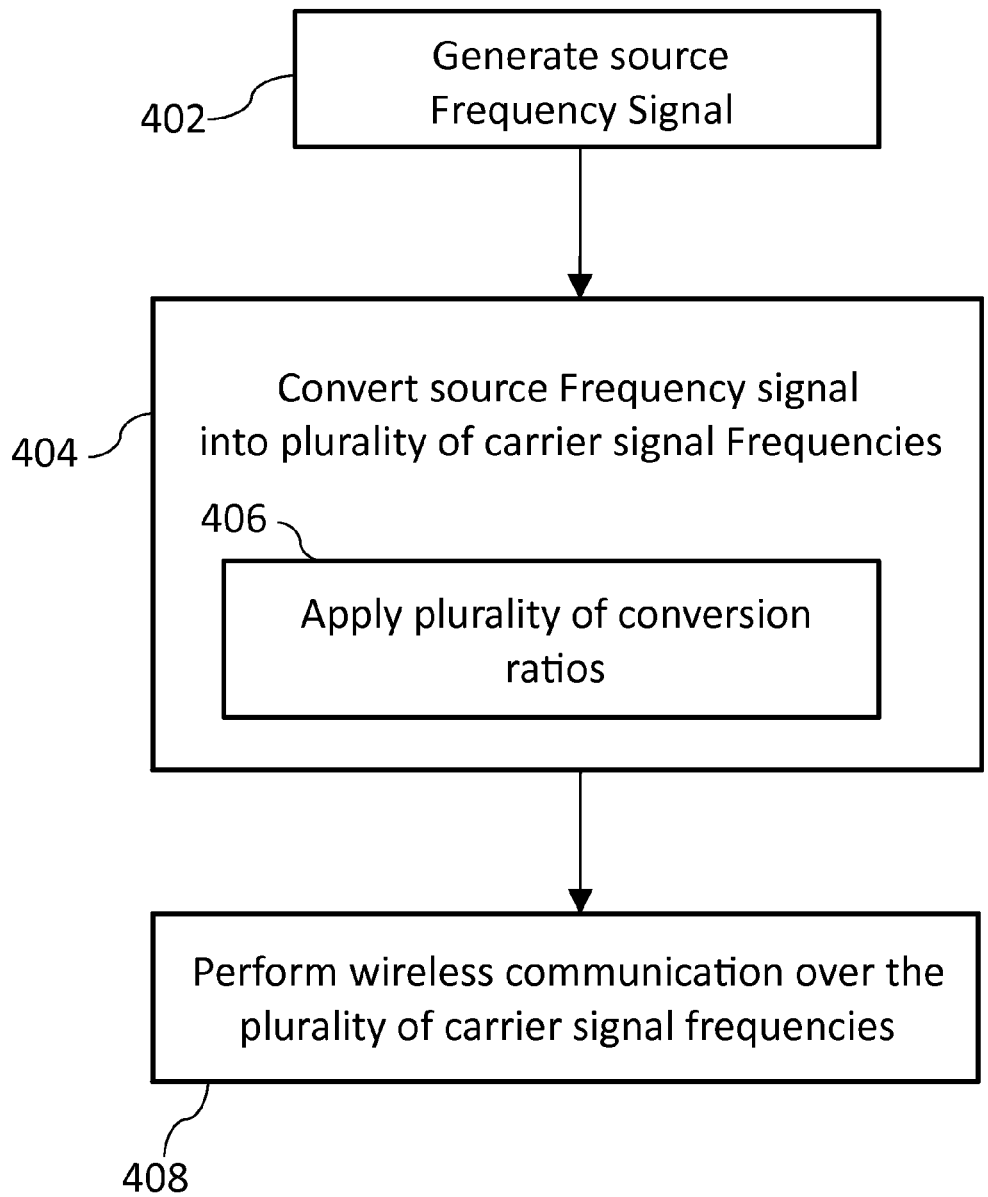
FIG. 4 is a schematic flow-chart illustration of a method of wireless communication over a plurality of wireless communication frequency channels, in accordance with some demonstrative embodiments.

Reference is made to FIG. 4, which schematically illustrates a method of wireless communication over a plurality of wireless communication frequency channels, in accordance with some demonstrative embodiments. In some embodiments, one or more operations of the method of FIG. 4 may be performed by one or more elements of a system, e.g., system 100 (FIG. 1), for example, device 102 (FIG. 2) and/or wireless communication unit 112 (FIG. 1).

As indicated at block 402, the method may include generating a source frequency signal. For example, frequency source 142 (FIG. 1) may generate source frequency signal 143 (FIG. 1). In one example, controller 160 (FIG. 1) may control frequency source 142 (FIG. 1) to generate source frequency signal 143 (FIG. 1) of a required frequency, e.g., as described above.

As indicated at block 404, the method may include converting the source frequency signal into a plurality of different configurable carrier signal frequencies. For example, LO generators 144 and 148 (FIG. 1) may convert source frequency signal 143 (FIG. 1) into configurable carrier signal frequencies 152 and 154 (FIG. 1), respectively, e.g., as described above.

As indicated at block 406, converting the source frequency signal into the plurality of different configurable carrier signal frequencies may include applying to the source frequency signal a plurality of respective conversion ratios. For example, controller 160 (FIG. 1) may control LO generators 144 and 148 (FIG. 1), e.g., using inputs 146 and 150 (FIG. 1), respectively, to configure the conversion ratios applied by LO generators 144 and 148 (FIG. 1) to source frequency signal 143 (FIG. 1), e.g., as described above.

As indicated at block 408, the method may include simultaneously communicating over the plurality of carrier signal frequencies. For example, wireless communication unit 112 (FIG. 1) may simultaneously communicate over carrier signal frequencies 152 and 154 (FIG. 1), e.g., as described above.

In one example, the plurality of carrier signal frequencies may include at least first and second non-contiguous frequencies of a common non-contiguous communication channel, e.g., as described above.

In another example, communicating over the plurality of carrier signal frequencies may include transmitting a first transmission over a first carrier signal frequency of the plurality of first carrier signals, e.g., carrier signal frequency 152 (FIG. 1), and receiving a second transmission over a first carrier signal frequency of the plurality of first carrier signals, e.g., carrier signal frequency 154 (FIG. 1).

In yet another example, the plurality of carrier signal frequencies may include frequencies within at least first and second different wireless communication frequency bands.

Some embodiments may be implemented using an article including one or more types of computer-readable storage media capable of storing data, including volatile memory, non-volatile memory, removable or non-removable memory, erasable or non-erasable memory, writeable or re-writeable memory, and the like. For example, the machine-readable storage medium may include, random-access memory (RAM), dynamic RAM (DRAM), Double-Data-Rate DRAM (DDR-DRAM), synchronous DRAM (SDRAM), static RAM (SRAM), read-only memory (ROM), programmable ROM (PROM), erasable programmable ROM (EPROM), electrically erasable programmable ROM (EEPROM), Compact Disk ROM (CD-ROM), Compact Disk Recordable (CD-R), Compact Disk Rewriteable (CD-RW), flash memory (e.g., NOR or NAND flash memory), content addressable memory (CAM), polymer memory, phase-change memory, ferroelectric memory, silicon-oxide-nitride-oxide-silicon (SONOS) memory, a disk, a floppy disk, a hard drive, an optical disk, a magnetic disk, a card, a magnetic card, an optical card, a tape, a cassette, and the like. The computer-readable storage media may include any suitable media involved with downloading or transferring a computer program from a remote computer to a requesting computer carried by data signals embodied in a carrier wave or other propagation medium through a communication link, e.g., a modem, radio or network connection.

In some embodiments, the article may include logic in the form of instructions, data, and/or code, which, if executed by a machine, may cause the machine to perform a method, process and/or operations as described herein. The machine may include, for example, any suitable processing platform, computing platform, computing device, processing device, computing system, processing system, computer, processor, or the like, and may be implemented using any suitable combination of hardware, software, firmware, and the like.

In some embodiments, the logic may include, or may be implemented as, software, a software module, an application, a program, a subroutine, instructions, an instruction set, computing code, words, values, symbols, and the like. The instructions may include any suitable type of code, such as source code, compiled code, interpreted code, executable code, static code, dynamic code, and the like. The instructions may be implemented according to a predefined computer language, manner or syntax, for instructing a processor to perform a certain function. The instructions may be implemented using any suitable high-level, low-level, object-oriented, visual, compiled and/or interpreted programming language, such as C, C++, Java, BASIC, Matlab, Pascal, Visual BASIC, assembly language, machine code, and the like.

Functions, operations, components and/or features described herein with reference to one or more embodiments, may be combined with, or may be utilized in combination with, one or more other functions, operations, components and/or features described herein with reference to one or more other embodiments, or vice versa.

While certain features of the invention have been illustrated and described herein, many modifications, substitutions, changes, and equivalents may occur to those skilled in the art. It is, therefore, to be understood that the appended claims are intended to cover all such modifications and changes as fall within the true spirit of the invention.

What is claimed is:

1. A wireless communication device comprising:
   a frequency source to generate a source frequency signal;
   a plurality of local-oscillator (LO) generators to generate a respective plurality of different carrier signal frequencies based on said source frequency signal, wherein the plurality of LO generators include a configurable LO generator to receive a plurality of configurable input values and generate a configurable carrier signal frequency of the plurality of different carrier signal frequencies based on the received plurality of configurable input values; and
   a plurality of radio-frequency (RF) paths to simultaneously communicate over said plurality of carrier signal frequencies, respectively,
   wherein the plurality of carrier signal frequencies include at least first and second non-contiguous frequencies of a common non-contiguous communication channel, wherein the common non-contiguous communication channel includes a non-contiguous communication channel within a five Gigahertz frequency band.

2. The wireless communication device of claim 1, wherein said plurality of carrier signal frequencies include a plurality of configurable carrier signal frequencies, and wherein said plurality of LO generators includes a plurality of configurable LO generators to generate said plurality of configurable carrier signal frequencies, respectively.

3. The wireless communication device of claim 2, wherein the configurable LO generators are to generate the configurable carrier signal frequencies by applying a plurality of configurable conversion ratios to the source frequency signal, wherein each of the plurality of configurable conversion ratios is based on a distinct combination of the plurality of configurable input values.

4. The wireless communication device of claim 1, wherein the configurable LO generator comprises:
   first and second frequency mixers;
   a first programmable divider to generate a first divider output by dividing a first mixer output of the first mixer by a first of the plurality of configurable input values; and
   a second programmable divider to generate a second divider output by dividing a second mixer output of the second mixer by a second of the plurality of configurable input values,
   wherein the first frequency mixer is to generate the first mixer output based on the second divider output, and the second frequency mixer is to generate the second mixer output based on the first divider output.

5. The wireless communication device of claim 1, wherein the plurality of RF paths includes at least a receive path and a transmit path.

6. The wireless communication device of claim 1, wherein the plurality of carrier signal frequencies include frequencies within at least first and second different wireless communication frequency bands.

7. The wireless communication device of claim 1, wherein said frequency source comprises a single phase-locked-loop to generate the source frequency signal.

8. The wireless communication device of claim 1, wherein the configurable LO generator comprises:
   a programmable divider to generate a divider output by dividing a mixer output of a mixer by at least one of the configurable input values.

9. The wireless communication device of claim 1, wherein each of the plurality of RF paths is associated with one of the plurality of LO generators such that that RF path is to communicate over only the carrier signal frequency generated by the one of the plurality of LO generators.

10. A wireless communication system comprising:
    a wireless communication device comprising:
    one or more antennas; and
    a wireless communication unit to simultaneously communicate over a plurality of different configurable carrier signal frequencies,
    wherein the plurality of carrier signal frequencies are configured based on a common source frequency signal by applying a plurality of configurable conversion ratios to the common source frequency signal, wherein at least one of the plurality of configurable conversion ratios is determined based on a plurality of configurable input values received at the wireless communication unit, and
    wherein the plurality of carrier signal frequencies include at least first and second non-contiguous frequencies of a common non-contiguous communication channel, wherein the common non-contiguous communication channel includes a non-contiguous communication channel within a five Gigahertz frequency band.

11. The wireless communication system of claim 10, wherein said wireless communication device comprises a plurality of configurable LO generators to generate said plurality of configurable carrier signal frequencies, respectively, based on the common source frequency signal.

12. The wireless communication system of claim 11, wherein the configurable LO generators are to generate the configurable carrier signal frequencies by applying a plurality of configurable conversion ratios to the source frequency signal.

13. The wireless communication system of claim 10, wherein the wireless communication unit is to transmit a first transmission over a first carrier signal frequency of the plurality of first carrier signals, and to receive a second transmission over a first carrier signal frequency of the plurality of first carrier signals.

14. The wireless communication system of claim 10, wherein the plurality of carrier signal frequencies include frequencies within at least first and second different wireless communication frequency bands.

15. The wireless communication system of claim 10, wherein said wireless communication unit comprises a single frequency source to generate the common source frequency signal.

16. A device comprising:
a frequency source to generate a common source frequency signal; and
a plurality of configurable local-oscillator (LO) generators to generate a respective plurality of different configurable frequencies based on said common source frequency signal, wherein at least one of the plurality of configurable LO generators is to receive a plurality of configurable input values, which are used to convert the common source frequency signal into at least one of the plurality of different configurable frequencies,
wherein the plurality of different configurable frequencies include at least first and second non-contiguous frequencies of a common non-contiguous communication channel, wherein the common non-contiguous communication channel includes a non-contiguous communication channel within a five Gigahertz frequency band.

17. The device of claim 16, wherein a combination of the plurality of configurable input values includes a conversion ratio, which is applied to the common source frequency signal to generate the at least one of the plurality of different configurable frequencies.

18. The device of claim 16, wherein the frequency source comprises a single Voltage Controlled Oscillator (VCO) controlled by a single Phase-locked-loop (PLL).

19. A method of wireless communication, the method comprising:
generating a source frequency signal;
receiving a plurality of configurable input values;
converting said source frequency signal into a plurality of different configurable carrier signal frequencies by applying to the source frequency signal a plurality of respective conversion ratios, wherein at least one of the plurality of configurable conversion ratios is determined based on the plurality of configurable input values, and wherein the plurality of different configurable carrier signal frequencies include at least first and second non-contiguous frequencies of a common non-contiguous communication channel, wherein the common non-contiguous communication channel includes a non-contiguous communication channel within a five Gigahertz frequency band; and
simultaneously communicating over said plurality of carrier signal frequencies.

20. The method of claim 19, wherein communicating over said plurality of carrier signal frequencies comprises transmitting a first transmission over a first carrier signal frequency of the plurality of first carrier signals, and receiving a second transmission over a first carrier signal frequency of the plurality of first carrier signals.

21. The method of claim 19, wherein the plurality of carrier signal frequencies include frequencies within at least first and second different wireless communication frequency bands.

22. A non-transitory computer-readable storage medium containing instructions that, if executed, enable wireless communication by:
generating a source frequency signal;
receiving a plurality of configurable input values;
converting said source frequency signal into a plurality of different configurable carrier signal frequencies by applying to the source frequency signal a plurality of respective conversion ratios, wherein at least one of the plurality of configurable conversion ratios is determined based on the plurality of configurable input values, and wherein the plurality of different configurable carrier signal frequencies include at least first and second non-contiguous frequencies of a common non-contiguous communication channel, wherein the common non-contiguous communication channel includes a non-contiguous communication channel within a five Gigahertz frequency band; and
simultaneously communicating over said plurality of carrier signal frequencies.

23. The non-transitory computer-readable storage medium of claim 22, wherein communicating over said plurality of carrier signal frequencies comprises:
transmitting a first transmission over a first carrier signal frequency of the plurality of first carrier signals, and
receiving a second transmission over a first carrier signal frequency of the plurality of first carrier signals.

24. The non-transitory computer-readable storage medium of claim 22, wherein the plurality of carrier signal frequencies include frequencies within at least first and second different wireless communication frequency bands.

25. A wireless communication device comprising:
a frequency source to generate a source frequency signal;
a plurality of configurable local-oscillator (LO) generators to generate a respective plurality of configurable carrier signal frequencies based on said source frequency signal, wherein the plurality of carrier signal frequencies include at least first and second non-contiguous channels of a non-contiguous communication channel within a five Gigahertz frequency band, at least one of the first and second non-contiguous channels having a bandwidth of 80 MHz, and at least one of the first and second non-contiguous channels having a plurality of contiguous 20 MHz sub-channels; and
a plurality of radio-frequency (RF) paths to simultaneously communicate over said plurality of configurable carrier signal frequencies, respectively.

26. The wireless communication device of claim 25, wherein the configurable LO generators are to generate the configurable carrier signal frequencies by applying a plurality of configurable conversion ratios to the source frequency signal.

27. The device of claim 26, wherein a configurable LO generator of said configurable LO generators comprises:
- first and second frequency mixers;
- a first programmable divider to generate a first divider output by dividing a first mixer output of the first mixer by a first configurable input value; and
- a second programmable divider to generate a second divider output by dividing a second mixer output of the second mixer by a second configurable input value,
- wherein the first frequency mixer is to generate the first mixer output based on the second divider output, and the second frequency mixer is to generate the second mixer output based on the first divider output.

28. The wireless communication device of claim 25, wherein each of the plurality of RF paths is associated with one of the plurality of LO generators such that that RF path is to communicate over only the carrier signal frequency generated by the one of the plurality of LO generators.

29. A wireless communication system comprising:
- a processor;
- a memory unit
- an input unit;
- an output unit;
- one or more antennas; and
- a wireless communication device including:
- a frequency source to generate a source frequency signal;
- a plurality of local-oscillator (LO) generators to generate a respective plurality of different carrier signal frequencies based on said source frequency signal, wherein the plurality of LO generators include a configurable LO generator to receive a plurality of configurable input values and generate a configurable carrier signal frequency of the plurality of different carrier signal frequencies based on a combination of the received plurality of configurable input values; and
- a plurality of radio-frequency (RF) paths to simultaneously communicate over said plurality of carrier signal frequencies, respectively,
- wherein the plurality of carrier signal frequencies include at least first and second non-contiguous frequencies of a common non-contiguous communication channel, wherein the common non-contiguous communication channel includes a non-contiguous communication channel within a five Gigahertz frequency band.

30. The wireless communication system of claim 29, wherein said plurality of carrier signal frequencies include a plurality of configurable carrier signal frequencies, and wherein said plurality of LO generators includes a plurality of configurable LO generators to generate said plurality of configurable carrier signal frequencies, respectively.

31. The wireless communication system of claim 30, wherein the configurable LO generators are to generate the configurable carrier signal frequencies by applying a plurality of configurable conversion ratios to the source frequency signal, wherein each of the plurality of configurable conversion ratios is based on a distinct combination of the plurality of configurable input values.

32. The wireless communication system of claim 29, wherein each of the plurality of RF paths is associated with one of the plurality of LO generators such that that RF path is to communicate over only the carrier signal frequency generated by the one of the plurality of LO generators.

* * * * *